United States Patent
Banister et al.

(10) Patent No.: US 9,500,186 B2
(45) Date of Patent: Nov. 22, 2016

(54) HIGH SURFACE AREA POLYMER ACTUATOR WITH GAS MITIGATING COMPONENTS

(75) Inventors: Mark Banister, Tucson, AZ (US); Raymond Clark, Tucson, AZ (US); Erich Coiner, Poway, CA (US); Yordan M. Geronov, Tucson, AZ (US); Mark D. McWilliams, San Diego, CA (US); Mark A. Van Veen, Cardiff by the Sea, CA (US)

(73) Assignee: MEDIPACS, INC., Tucson, AZ (US)

( * ) Notice: Subject to any disclaimer, the term of this patent is extended or adjusted under 35 U.S.C. 154(b) by 1086 days.

(21) Appl. No.: 13/018,024

(22) Filed: Jan. 31, 2011

(65) Prior Publication Data

US 2012/0029430 A1 Feb. 2, 2012

Related U.S. Application Data (60) Provisional application No. 61/300,345, filed on Feb. 1, 2010, provisional application No. 61/332,760, filed on May 8, 2010, provisional application No. 61/432,108, filed on Jan. 12, 2011.

(51) Int. Cl.
*F03G 7/05* (2006.01)
*F03G 7/00* (2006.01)

(52) U.S. Cl.
CPC .................... *F03G 7/005* (2013.01)

(58) Field of Classification Search
CPC ................ F03G 7/005; A61M 5/142
USPC ...................... 424/486; 435/173.6
See application file for complete search history.

(56) References Cited

U.S. PATENT DOCUMENTS

| | | | |
|---|---|---|---|
| 3,029,743 A | 4/1962 | Johns | 103/150 |
| 3,922,328 A | 11/1975 | Johnson | |
| 4,034,380 A | 7/1977 | Isayama | 347/19 |
| 4,111,202 A | 9/1978 | Theeuwes | |
| 4,190,411 A | 2/1980 | Fujimoto | |
| 4,203,440 A | 5/1980 | Theeuwes | |
| 4,299,220 A | 11/1981 | Dorman | 604/118 |
| 4,327,725 A | 5/1982 | Cortese et al. | 424/427 |
| 4,395,719 A | 7/1983 | Majewski et al. | 346/140 |
| 4,423,166 A | 12/1983 | Moriarity et al. | 523/414 |
| 4,432,699 A | 2/1984 | Beckman | |
| 4,449,893 A | 5/1984 | Beckman | 417/322 |
| 4,449,983 A | 5/1984 | Cortese et al. | 604/892 |
| 4,507,363 A | 3/1985 | Chow et al. | 428/418 |
| 4,538,607 A * | 9/1985 | Saul | 128/207.16 |

(Continued)

FOREIGN PATENT DOCUMENTS

| | | | | |
|---|---|---|---|---|
| CA | 2477181 | 4/2004 | | F04B 43/04 |
| CN | 1080829 | 3/2002 | | F04B 35/00 |

(Continued)

OTHER PUBLICATIONS

Office Action issued Nov. 23, 2012 is U.S. Appl. No. 12/745,880 (26 pgs.).

(Continued)

*Primary Examiner* — Terrance Kenerly
(74) *Attorney, Agent, or Firm* — Hayes Soloway P.C.

(57) ABSTRACT

A polymer actuator component and a polymer actuator assembly, power supply and method of using the activation are described.

10 Claims, 6 Drawing Sheets

(56) References Cited

U.S. PATENT DOCUMENTS

| | | | |
|---|---|---|---|
| 4,551,139 A | 11/1985 | Plaas et al. | |
| 4,559,038 A | 12/1985 | Berg et al. | |
| 4,595,583 A | 6/1986 | Eckenhoff et al. | |
| 4,624,847 A | 11/1986 | Ayer et al. | |
| 4,624,848 A | 11/1986 | Lee | |
| 4,650,469 A | 3/1987 | Berg et al. | |
| 4,655,767 A | 4/1987 | Woodward et al. | |
| 4,663,149 A | 5/1987 | Eckenhoff et al. | |
| 4,675,174 A | 6/1987 | Eckenhoff | |
| 4,723,958 A | 2/1988 | Pope et al. | |
| 4,772,474 A | 9/1988 | Eckenhoff et al. | |
| 4,781,714 A | 11/1988 | Eckenhoff et al. | |
| 4,808,084 A | 2/1989 | Tsubouchi et al. | 417/322 |
| 4,810,535 A | 3/1989 | McCollum et al. | 427/410 |
| 4,842,493 A | 6/1989 | Nilsson | 417/322 |
| 4,863,456 A | 9/1989 | Stephens et al. | |
| 4,948,592 A | 8/1990 | Ayer et al. | |
| 4,963,141 A | 10/1990 | Eckenhoff | |
| 5,000,957 A | 3/1991 | Eckenhoff et al. | |
| 5,034,229 A | 7/1991 | Magruder et al. | |
| 5,037,420 A | 8/1991 | Magruder et al. | |
| 5,059,423 A | 10/1991 | Magruder et al. | |
| 5,061,242 A | 10/1991 | Sampson | |
| 5,070,560 A | 12/1991 | Wilkinson | 5/455 |
| 5,100,933 A * | 3/1992 | Tanaka et al. | 523/300 |
| 5,105,983 A | 4/1992 | Sancoff et al. | 222/103 |
| 5,110,596 A | 5/1992 | Magruder et al. | |
| 5,192,197 A | 3/1993 | Culp | 417/322 |
| 5,232,702 A | 8/1993 | Pfister et al. | |
| 5,246,705 A | 9/1993 | Venkatraman et al. | |
| 5,279,544 A | 1/1994 | Gross et al. | |
| 5,279,565 A | 1/1994 | Klein et al. | |
| 5,284,133 A | 2/1994 | Burns et al. | |
| 5,300,299 A | 4/1994 | Sweet et al. | |
| 5,304,121 A | 4/1994 | Sahatjian | |
| 5,327,041 A | 7/1994 | Culp | 310/328 |
| 5,328,696 A | 7/1994 | Noel | |
| 5,336,057 A | 8/1994 | Fukuda et al. | 417/395 |
| 5,348,746 A | 9/1994 | Dong et al. | |
| 5,354,264 A | 10/1994 | Bae et al. | |
| 5,376,378 A | 12/1994 | Li et al. | |
| 5,380,760 A | 1/1995 | Wendel et al. | |
| 5,412,821 A | 5/1995 | Wilkinson | 5/455 |
| 5,429,585 A | 7/1995 | Liang | 601/15 |
| 5,431,921 A | 7/1995 | Thombre | |
| 5,474,783 A | 12/1995 | Miranda et al. | |
| 5,498,255 A | 3/1996 | Wong | |
| 5,546,932 A | 8/1996 | Galli | |
| 5,573,668 A | 11/1996 | Grosh et al. | |
| 5,587,237 A | 12/1996 | Korpman et al. | |
| RE35,474 E | 3/1997 | Woodard et al. | |
| 5,618,899 A | 4/1997 | Appelt et al. | |
| 5,622,482 A | 4/1997 | Lee | 417/321 |
| 5,630,709 A | 5/1997 | Bar-Cohen | 417/322 |
| 5,633,009 A | 5/1997 | Kenealy et al. | |
| 5,645,855 A | 7/1997 | Lorenz | |
| 5,656,286 A | 8/1997 | Miranda et al. | |
| 5,674,192 A | 10/1997 | Sahatjian et al. | |
| 5,687,748 A | 11/1997 | Conrad et al. | |
| 5,692,256 A | 12/1997 | Kramer et al. | 5/624 |
| 5,714,160 A | 2/1998 | Magruder et al. | |
| 5,718,700 A | 2/1998 | Edgren et al. | |
| 5,779,668 A | 7/1998 | Grabenkort | |
| 5,798,600 A | 8/1998 | Sager et al. | 310/330 |
| 5,810,001 A | 9/1998 | Genga et al. | 128/202.27 |
| 5,823,178 A | 10/1998 | Lloyd et al. | |
| 5,891,463 A | 4/1999 | Bello et al. | |
| 5,916,968 A | 6/1999 | Hariharan et al. | |
| 5,939,477 A | 8/1999 | Pretzer et al. | |
| 5,951,999 A | 9/1999 | Therriault et al. | |
| 5,954,706 A | 9/1999 | Sahatjian | |
| 5,961,298 A | 10/1999 | Bar-Cohen et al. | 417/322 |
| 5,979,892 A | 11/1999 | Smith | 271/267 |
| 5,997,501 A | 12/1999 | Gross et al. | |
| 6,004,115 A | 12/1999 | Da Costa | 417/413 |
| 6,010,485 A | 1/2000 | Buch-Rasmussen et al. | |
| 6,024,976 A | 2/2000 | Miranda et al. | |
| 6,066,325 A | 5/2000 | Wallace et al. | |
| RE36,754 E | 6/2000 | Noel | |
| 6,074,178 A | 6/2000 | Bishop et al. | 417/322 |
| 6,074,179 A | 6/2000 | Jokela et al. | |
| 6,106,245 A | 8/2000 | Cabuz | 417/322 |
| 6,109,852 A | 8/2000 | Shahinpoor et al. | 414/1 |
| 6,143,138 A | 11/2000 | Becker | 204/157.15 |
| 6,152,898 A | 11/2000 | Olsen | |
| 6,157,113 A | 12/2000 | Hunter et al. | 310/300 |
| 6,165,155 A | 12/2000 | Jacobsen et al. | |
| 6,174,546 B1 | 1/2001 | Therriault et al. | |
| 6,180,133 B1 | 1/2001 | Quan et al. | |
| 6,183,434 B1 | 2/2001 | Eppstein | |
| 6,184,608 B1 | 2/2001 | Cabuz et al. | 310/309 |
| 6,193,996 B1 | 2/2001 | Effing et al. | |
| 6,206,850 B1 | 3/2001 | O'Neil | |
| 6,210,712 B1 | 4/2001 | Edgren et al. | |
| 6,213,739 B1 | 4/2001 | Phallen et al. | 417/478 |
| 6,221,383 B1 | 4/2001 | Miranda et al. | |
| 6,223,369 B1 | 5/2001 | Maier et al. | 5/713 |
| 6,249,076 B1 | 6/2001 | Madden et al. | 310/363 |
| 6,277,401 B1 | 8/2001 | Bello et al. | |
| 6,312,715 B1 | 11/2001 | Cantor et al. | |
| 6,316,022 B1 | 11/2001 | Mantelle et al. | |
| 6,319,245 B1 | 11/2001 | Berrigan | |
| 6,336,907 B1 | 1/2002 | Dono et al. | 601/150 |
| 6,337,086 B1 | 1/2002 | Kanios et al. | |
| 6,352,715 B1 | 3/2002 | Hwang et al. | |
| 6,365,178 B1 | 4/2002 | Venkateshwaran et al. | |
| 6,365,185 B1 | 4/2002 | Ritschel et al. | |
| 6,368,318 B1 | 4/2002 | Visuri et al. | |
| 6,378,292 B1 | 4/2002 | Youngner | 60/224 |
| 6,387,077 B1 | 5/2002 | Klibanov et al. | |
| 6,392,777 B1 | 5/2002 | Elliott et al. | |
| 6,409,716 B1 | 6/2002 | Sahatjian et al. | |
| 6,450,773 B1 | 9/2002 | Upton | 417/53 |
| 6,461,644 B1 | 10/2002 | Jackson et al. | |
| 6,464,476 B2 | 10/2002 | Ross et al. | 417/478 |
| 6,471,686 B1 | 10/2002 | Berrigan | |
| 6,475,639 B2 | 11/2002 | Shahinpoor et al. | 428/614 |
| 6,490,483 B2 | 12/2002 | Wallis | 604/20 |
| 6,531,152 B1 | 3/2003 | Lerner et al. | |
| 6,537,194 B1 | 3/2003 | Winkler | |
| 6,578,245 B1 | 6/2003 | Chatterjee et al. | 29/25.35 |
| 6,632,522 B1 | 10/2003 | Hyde et al. | |
| 6,664,718 B2 | 12/2003 | Pelrine et al. | 310/800 |
| 6,682,318 B2 | 1/2004 | Takeuchi et al. | 417/322 |
| 6,682,500 B2 | 1/2004 | Soltanpour et al. | 604/9 |
| 6,685,442 B2 | 2/2004 | Chinn et al. | 417/321 |
| 6,726,678 B1 | 4/2004 | Nelson | 604/891.1 |
| 6,766,817 B2 | 7/2004 | Da Silva | F04F 10/00 |
| 6,791,003 B1 | 9/2004 | Choi et al. | |
| 6,796,970 B1 | 9/2004 | Klitmose et al. | |
| 6,809,462 B2 | 10/2004 | Pelrine et al. | 310/319 |
| 6,864,295 B2 | 3/2005 | Mitarai | 521/50.5 |
| 6,869,275 B2 | 3/2005 | Dante et al. | 417/413.2 |
| 6,876,135 B2 | 4/2005 | Pelrine et al. | 310/339 |
| 6,902,704 B2 | 6/2005 | Wilson | 422/100 |
| 6,940,211 B2 | 9/2005 | Pelrine et al. | 310/330 |
| 6,948,636 B2 | 9/2005 | Fischer et al. | 222/103 |
| 6,949,079 B1 | 9/2005 | Westberg et al. | 604/6.11 |
| 6,955,923 B2 | 10/2005 | Hartting | 436/180 |
| 6,960,864 B2 | 11/2005 | Urano et al. | 310/307 |
| 7,285,255 B2 | 10/2007 | Kadlec et al. | A61L 2/16 |
| 7,411,792 B2 | 8/2008 | Richards et al. | 361/704 |
| 7,453,187 B2 | 11/2008 | Richards et al. | 310/339 |
| 7,544,260 B2 | 6/2009 | Banister et al. | 149/2 |
| 7,553,903 B2 | 6/2009 | Riegel et al. | 524/599 |
| 7,700,129 B2 | 4/2010 | Ito et al. | 424/486 |
| 7,820,427 B2 | 10/2010 | Unger et al. | 435/286.5 |
| 8,190,270 B2 | 5/2012 | Wingeier et al. | 607/116 |
| 2001/0053383 A1 | 12/2001 | Miranda et al. | |
| 2002/0004064 A1 | 1/2002 | Quan et al. | |
| 2002/0007014 A1 | 1/2002 | Hyde et al. | |
| 2002/0010412 A1 | 1/2002 | Eppstein | |
| 2002/0015733 A1 | 2/2002 | Flasher-Barak et al. | |
| 2002/0043895 A1 | 4/2002 | Richards et al. | 310/328 |

(56) References Cited

U.S. PATENT DOCUMENTS

| | | |
|---|---|---|
| 2002/0106402 A1 | 8/2002 | Hartwig |
| 2002/0115740 A1 | 8/2002 | Beuhler et al. ............... 522/152 |
| 2002/0128572 A1 | 9/2002 | Chang ......................... 601/148 |
| 2002/0128618 A1 | 9/2002 | Frenz et al. .................. 604/368 |
| 2002/0147208 A1 | 10/2002 | Fleshner-Barak et al. |
| 2002/0156463 A1 | 10/2002 | Berrigan |
| 2002/0173745 A1 | 11/2002 | Santini et al. .................. 604/67 |
| 2002/0183738 A1 | 12/2002 | Chee et al. |
| 2002/0193754 A1 | 12/2002 | Cho |
| 2003/0014036 A1 | 1/2003 | Varner et al. |
| 2003/0051292 A1 | 3/2003 | Ferrand et al. ................... 5/600 |
| 2003/0054025 A1 | 3/2003 | Cantor et al. |
| 2003/0065303 A1 | 4/2003 | Wellman et al. |
| 2003/0069359 A1 | 4/2003 | Torii et al. .................... 525/178 |
| 2003/0072792 A1 | 4/2003 | Flanigan et al. |
| 2003/0108590 A1 | 6/2003 | Peery et al. |
| 2003/0124189 A1 | 7/2003 | Zentner et al. |
| 2003/0135158 A1 | 7/2003 | Gonnelli |
| 2003/0139495 A1 | 7/2003 | Zentner et al. |
| 2003/0143257 A1 | 7/2003 | Fleshner-Barak et al. |
| 2003/0152616 A1 | 8/2003 | Hartwig |
| 2003/0153900 A1 | 8/2003 | Aceti et al. |
| 2003/0156953 A1 | 8/2003 | Chinn et al. ................... 417/332 |
| 2003/0163099 A1 | 8/2003 | Wermeling et al. |
| 2003/0216683 A1 | 11/2003 | Shekalim |
| 2003/0232198 A1 | 12/2003 | Lamberti et al. |
| 2004/0030262 A1 | 2/2004 | Fisher et al. |
| 2004/0068224 A1 | 4/2004 | Couvillon et al. ............... 604/67 |
| 2004/0092865 A1 | 5/2004 | Flaherty et al. |
| 2004/0102762 A1 | 5/2004 | Gilbert |
| 2004/0106893 A1 | 6/2004 | Hunter |
| 2004/0106894 A1 | 6/2004 | Hunter |
| 2004/0112442 A1 | 6/2004 | Maerkl et al. ................. 137/597 |
| 2004/0133159 A1 | 7/2004 | Haider et al. |
| 2004/0138603 A1 | 7/2004 | Cleary et al. |
| 2004/0142023 A1 | 7/2004 | Hartwig |
| 2004/0149288 A1 | 8/2004 | Koch |
| 2004/0176502 A1 | 9/2004 | Raymond et al. ............ 523/416 |
| 2004/0176748 A1 | 9/2004 | Abramson et al. |
| 2004/0186419 A1 | 9/2004 | Cho |
| 2004/0202708 A1 | 10/2004 | Roehrig et al. |
| 2004/0204677 A1 | 10/2004 | Wellman et al. |
| 2004/0219194 A1 | 11/2004 | Finckh et al. |
| 2004/0220548 A1 | 11/2004 | Heruth et al. |
| 2004/0234401 A1 | 11/2004 | Banister ........................ 417/474 |
| 2004/0242709 A1 | 12/2004 | Oguro et al. ..................... 521/27 |
| 2004/0265545 A1 | 12/2004 | McKean et al. ............... 428/189 |
| 2005/0033230 A1 | 2/2005 | Alchas et al. |
| 2005/0043657 A1 | 2/2005 | Couvillon ...................... 601/134 |
| 2005/0058695 A1 | 3/2005 | Anigbogu et al. |
| 2005/0137577 A1 | 6/2005 | Heruth et al. |
| 2005/0137578 A1 | 6/2005 | Heruth et al. |
| 2005/0137579 A1 | 6/2005 | Heruth et al. |
| 2005/0261631 A1 | 11/2005 | Clarke et al. |
| 2005/0273081 A1 | 12/2005 | Olsen |
| 2005/0273082 A1 | 12/2005 | Olsen |
| 2005/0287214 A1 | 12/2005 | Ayer et al. |
| 2006/0021614 A1 | 2/2006 | Wermeling et al. |
| 2006/0076540 A1 | 4/2006 | Zama et al. .................... 252/500 |
| 2006/0078603 A1 | 4/2006 | Nguyen |
| 2006/0078604 A1 | 4/2006 | Kanios et al. |
| 2006/0084942 A1 | 4/2006 | Kim et al. |
| 2006/0089619 A1 | 4/2006 | Ginggen ...................... 604/891.1 |
| 2006/0094985 A1 | 5/2006 | Aceti et al. |
| 2006/0094989 A1 | 5/2006 | Scott et al. ......................... 601/5 |
| 2006/0110596 A1 | 5/2006 | Palasz et al. |
| 2006/0135911 A1 | 6/2006 | Mittur |
| 2006/0142875 A1 | 6/2006 | Keyes et al. ....................... 700/1 |
| 2006/0183216 A1 | 8/2006 | Handique et al. .......... 435/287.1 |
| 2006/0188558 A1 | 8/2006 | Jackson et al. |
| 2006/0200083 A1 | 9/2006 | Freyman et al. ............. 604/181 |
| 2006/0204532 A1 | 9/2006 | John |
| 2006/0213674 A1 | 9/2006 | Dierker, Jr. et al. |
| 2006/0276744 A1 | 12/2006 | Falk |
| 2007/0021697 A1 | 1/2007 | Ginther et al. |
| 2007/0031495 A1 | 2/2007 | Eppstein et al. |
| 2007/0052139 A1 | 3/2007 | Gilbert |
| 2007/0078376 A1 | 4/2007 | Smith |
| 2007/0082038 A1 | 4/2007 | Gale et al. |
| 2007/0088267 A1 | 4/2007 | Shekalim |
| 2007/0092570 A1 | 4/2007 | Missel et al. |
| 2007/0098771 A1 | 5/2007 | Audett et al. |
| 2007/0098772 A1 | 5/2007 | Westcott et al. |
| 2007/0100355 A1 | 5/2007 | Bonde et al. |
| 2007/0104771 A1 | 5/2007 | Audett et al. |
| 2007/0134310 A1 | 6/2007 | Nedberge et al. |
| 2007/0148218 A1 | 6/2007 | Gordon |
| 2007/0190150 A1 | 8/2007 | Ito et al. ........................ 424/486 |
| 2007/0224253 A1 | 9/2007 | Franklin |
| 2007/0260201 A1 | 11/2007 | Prausnitz et al. |
| 2007/0269522 A1 | 11/2007 | Wold |
| 2007/0293826 A1 | 12/2007 | Wall et al. |
| 2008/0009800 A1 | 1/2008 | Nickel |
| 2008/0015494 A1 | 1/2008 | Santini, Jr. et al. |
| 2008/0033228 A1 | 2/2008 | Rastegar et al. ................. 600/16 |
| 2008/0039791 A1 | 2/2008 | Abboud et al. ............... 604/113 |
| 2008/0058706 A1 | 3/2008 | Zhang et al. |
| 2008/0063698 A1 | 3/2008 | Hartwig |
| 2008/0091139 A1 | 4/2008 | Srinivasan et al. ............. 604/68 |
| 2008/0110463 A1 | 5/2008 | Hajgato et al. |
| 2008/0125744 A1 | 5/2008 | Treacy |
| 2008/0152592 A1 | 6/2008 | Rebec |
| 2008/0167641 A1 | 7/2008 | Hansen et al. |
| 2008/0183144 A1 | 7/2008 | Trautman et al. |
| 2008/0195018 A1 | 8/2008 | Larson et al. .................... 602/53 |
| 2008/0208107 A1 | 8/2008 | McRae et al. |
| 2008/0214987 A1 | 9/2008 | Xu |
| 2008/0221552 A1 | 9/2008 | Leonard |
| 2008/0234656 A1 | 9/2008 | Pettis et al. |
| 2008/0312610 A1 | 12/2008 | Binks et al. |
| 2008/0317615 A1 | 12/2008 | Banister ...................... 417/413.1 |
| 2009/0007904 A1 | 1/2009 | Schuster et al. |
| 2009/0020521 A1 | 1/2009 | Blaszczykiewicz et al. .. 219/529 |
| 2009/0026069 A1 | 1/2009 | Liao et al. ..................... 204/274 |
| 2009/0041833 A1 | 2/2009 | Bettinger et al. |
| 2009/0042970 A1 | 2/2009 | Herschkowitz et al. |
| 2009/0048555 A1 | 2/2009 | Stryker et al. |
| 2009/0060986 A1 | 3/2009 | Yum et al. |
| 2009/0085444 A1 | 4/2009 | Alvarez Icaza Rivera et al. .............................. 310/365 |
| 2009/0099545 A1 | 4/2009 | Nilsson et al. |
| 2009/0118662 A1 | 5/2009 | Schnall |
| 2009/0221971 A1 | 9/2009 | Mejlhede et al. |
| 2009/0227988 A1 | 9/2009 | Wood, Jr. et al. ......... 604/891.1 |
| 2009/0232685 A1 | 9/2009 | Kamitani et al. .......... 417/413.2 |
| 2009/0317442 A1 | 12/2009 | Banister et al. .............. 424/423 |
| 2010/0004638 A1 | 1/2010 | Gibson ....................... 604/891.1 |
| 2010/0074953 A1 | 3/2010 | Chaouk et al. ............... 424/484 |
| 2011/0172645 A1 | 7/2011 | Moga et al. |

FOREIGN PATENT DOCUMENTS

| | | | |
|---|---|---|---|
| CN | 1934776 A | 3/2007 | ............ H02N 11/00 |
| DE | 199 12 606 | 12/2000 | ............ F04B 43/04 |
| EP | 0 723 982 | 7/1996 | ............ C08G 59/56 |
| EP | 0 736 556 | 9/1996 | ............ C08G 59/00 |
| EP | 0882890 | 12/1998 | ............ F04B 45/053 |
| EP | 1 454 935 | 8/2004 | ............ C08G 59/00 |
| JP | 58-25326 | 2/1983 | |
| JP | 60-235847 | 11/1985 | |
| JP | 2137930 | 5/1990 | ............ B41J 2/05 |
| JP | 02-004826 | 9/1990 | |
| JP | 08-283540 | 10/1996 | |
| JP | 9287571 | 11/1997 | ............ F04B 43/04 |
| JP | 2004-514770 | 5/2004 | |
| JP | 2004-261045 | 9/2004 | |
| JP | 2004-269882 | 9/2004 | |
| JP | 2005269773 | 9/2005 | ............ F03G 7/00 |
| JP | 2006353034 | 12/2006 | ............ H02N 2/00 |
| JP | 2008211915 | 9/2008 | ............ F03G 7/00 |
| JP | 2009046649 | 3/2009 | ............ C08F 12/34 |
| WO | WO 96/17170 | 6/1996 | ............ F04B 35/00 |
| WO | WO 96/20971 | 11/1996 | ............ C08G 63/00 |
| WO | WO 97/42412 | 11/1997 | ............ F04B 43/12 |

(56) References Cited

FOREIGN PATENT DOCUMENTS

| WO | WO 00/28215 | 5/2000 | ............ F04B 45/047 |
|---|---|---|---|
| WO | WO 02/44240 | 6/2002 | ............ C08G 59/40 |
| WO | WO 2004/031581 | 4/2004 | ............ F04B 43/04 |
| WO | WO 2004/076859 | 9/2004 | ............ F04B 43/04 |
| WO | WO 2005/061014 | 7/2005 | |
| WO | WO 2005/118008 | 12/2005 | |
| WO | WO 2006/065884 | 6/2006 | |
| WO | WO 2008/079440 | 7/2008 | ............ C08L 63/10 |
| WO | WO2008129549 | 10/2008 | ............ A61M 5/148 |
| WO | WO 2009/069086 | 4/2009 | |
| WO | WO2011032011 | 3/2011 | ............ A61M 5/142 |

OTHER PUBLICATIONS

Search Report and Written Opinion received in Applicant's corresponding European Patent Application Serial No. 05854009.7, Nov. 11, 2009.
Canadian Official Action issued in Canadian Patent Application Serial No. 2,557,325 dated Feb. 8, 2011 (5 pgs).
"An Electrochemical Microactuator: Principle and First Results", Neagu et al., Journal of Microelectromechanical Systems, vol. 5. No. 1, Mar. 1996.
"Micro-Dispensing Positive Displacement Pump", Anonymous, Research Disclosure, Mason Publications, Hampshire GB, vol. 374, No. 4, Jun. 1995.
"Magnetic Driven Compression Cascade and Packaging", IBM Technical Disclosure Bulletin, IBM Corp., col. 38, No. 1, Jan. 1995.
"Structure and Mechanism of Two Types of Micro-Pump Using Polymer Gel", Hattori et al., Micro Electro Mechanical Systems, 1992, MEMS 92, Proceedings. An Investigation of Micro Structures, Sensors, Actuators, Machines and Robot, IEEE Travemunde, Germany, Feb. 1992.
US Official Action issued Aug. 27, 2010 in related U.S. Appl. No. 11/721,800 (13 pgs).
Official. Action in Chinese Application No. 200480010203.3, Nov. 14, 2008 and Sep. 14, 2007.
Official Action in EPO Application No. 04 714 231.0-2315, Jan. 25, 2007 and Nov. 13, 2008.
PCT International Search Report and International Preliminary Report on Patentability, dated Aug. 26, 2005, PCT/US04/005922.
PCT International Search Report and International Preliminary Report on Patentability, dated Oct. 25, 2006, PCT/US05/45210.
PCT International Search Report and International Preliminary Report on Patentability, dated Jul. 7, 2008, PCT/US07/73188.
Unsolicited letter from Dr. Elson Silva, dated Oct. 21, 2010 (5 pgs).
European Office Action dated Sep. 14, 2010, Appln. No. 07 872 242.8-2102, (6 pgs).
"Epoxy-Based Electroactive Polymer Gels", Yoshioka Y and Calvert P, Experimental Mechanics, vol. 42, No. 4, Dec. 2002, pp. 404-408.
PCT International Search Report and International Preliminary Report on Patentability, dated Feb. 19, 2009, PCT/US08/85421.
Indian Examination Report; Indian Patent Application Serial No. 2371/CHENP/2005, dated Sep. 7, 2006.
Official Action, U.S. Appl. No. 11/721,800, dated Aug. 27, 2010.
Yoshioka et al., "Electrically Driven Miniature Hydrogels as Muscle-Like Acuators", 2001; Proceedings of SPIE vol. 4329, pp. 216-222.
PCT International Search Report and Written Opinion dated Mar. 28, 2011 PCT/US11/23375.
European Search Report dated Jun. 8, 2009, Serial No. 07872242. 8-2102.
International Search Report and Written Opinion of the International Search Authority issued in PCT/US09/34557, dated Apr. 13, 2009 (7 pgs).
European Search Report dated Feb. 18, 2011 issued in European Application Serial No. 10014840.2-2315 (7 pgs).
Chinese Official Action dated Mar. 17, 2011, Appln. No. 200580048306.3.

"ElectroActive Polymers—EAPs," downloaded from http://www.azom.com on Dec. 16, 2013 (5 pgs).
Bar-Cohen, Y., "Electroactive polymers (EAP) actuators as artificial muscles: reality, potential and challenges," SPIE Press, 2001, 671 pgs, (book description only, 4 pgs).
Chinese Notification of ReExamination and English translation, Appln. or Pat. No. 200580048306.3; dated Aug. 22, 2014 (11 pgs).
Chinese Office Action (w/English translation) issued in corresponding application No. 200780032137.3, dated Mar. 12, 2013 (14 pgs).
Chinese Office Action and Translation dated Jul. 6, 2011 issued in Chinese Patent Appln. No. 200780032137.3 (7 pgs).
Chinese Office Action, Application/Patent No. 200780032137.3, dated Dec. 23, 2011 (6 pgs).
Chinese Official Action + translation dated Feb. 1, 2011 issued in Appln. No. 200780032137.3, (8 pgs).
Chinese Official Action issued in corresponding Chinese Patent Appln. Serial No. 200580048306.3 dated Nov. 4, 2011 (5 pgs).
European Official Action issued in Appln. No. 04714231.0, dated May 11, 2011 (2 pgs).
European Official Action issued in Appln. No. 04714231.0-2315/ 1611353, dated Oct. 4, 2010 (4 pgs).
European Official Action, Apr. 6, 2011 issued in Appln. No. 07 872 242.8-2102 (4 pages).
European Official Action, Aug. 29, 2011 issued in Appln. No. 07 872 242.8-2102 (6 pages).
First Examination Report dated Dec. 31, 2013, Indian Patent Application No. 3011/CHENP/2007 (2 pgs).
International Preliminary Report on Patentability issued in PCT/ US10/48489 dated Mar. 13, 2012 (12 pgs).
International Search Report and Written Opinion issued in corresponding PCT Patent Appln. Serial No. PCT/US2012/057129 dated Apr. 1, 2014 ( 7 pgs).
Japanese Office Action with translation, Patent Appln. 2009-519642, dated Jul. 9, 2012 (9 pgs).
Office Action issued in related U.S. Appl. No. 10/786,718, dated Mar. 5, 2008 (41 pgs).
Office Action issued in related U.S. Appl. No. 10/786,718, dated Sep. 16, 2008 (8 pgs).
Office Action issued in related U.S. Appl. No. 10/786,718, dated Jan. 2, 2009 (9 pgs).
Office Action issued in related U.S. Appl. No. 10/786,718, dated Jul. 1, 2009 (7 pgs).
Office Action issued in related U.S. Appl. No. 10/786,718, dated Dec. 28, 2009 (6 pgs).
Office Action issued in related U.S. Appl. No. 10/786,718, dated May 5, 2010 (7 pgs).
Office Action issued in related U.S. Appl. No. 10/786,718, dated Sep. 15, 2010 (8 pgs).
Office Action issued in related U.S. Appl. No. 10/786,718, dated Nov. 23, 2010 (10 pgs).
Office Action issued in related U.S. Appl. No. 11/254,537, dated Sep. 17, 2007 (8 pgs).
Office Action issued in related U.S. Appl. No. 11/254,537, dated Mar. 4, 2008 (8 pgs).
Office Action issued in related U.S. Appl. No. 11/254,537, dated Jul. 21, 2008 (10 pgs).
Office Action issued in related U.S. Appl. No. 11/254,537, dated Dec. 15, 2008 (8 pgs).
Office Action issued in related U.S. Appl. No. 12/373,245, dated Feb. 2, 2011 (13 pgs).
Office Action issued in related U.S. Appl. No. 12/373,245, dated Jul. 22, 2011 (11 pgs).
Office Action issued in related U.S. Appl. No. 12/373,245, dated Jun. 30, 2014 (18 pgs).
Office Action issued in related U.S. Appl. No. 12/414,536, dated Nov. 29, 2010 (8 pgs).
Office Action issued in related U.S. Appl. No. 12/978,152, dated May 23, 2011 (9 pgs).
Office Action issued in related U.S. Appl. No. 13/093,648, dated Aug. 29, 2013 (5 pgs).
Office Action issued in related U.S. Appl. No. 13/395,627, dated Sep. 10, 2014 (9 pgs).

(56) References Cited

OTHER PUBLICATIONS

Office Action issued in related U.S. Appl. No. 13/424,172, dated Jun. 27, 2012 (14 pgs).
Office Action issued in related U.S. Appl. No. 13/424,172, dated Nov. 9, 2012 (6 pgs).
Office Action issued in related U.S. Appl. No. 14/071,371, dated Aug. 21, 2014 (16 pgs).
Office Action issued in related U.S. Appl. No. 12/745,880, dated Jun. 3, 2013 (8 pgs).
Official Action received in corresponding Chinese Application No. 200480010203.3, Nov. 14, 2008 (5 pgs).
PCT International Search Report and Written Opinion, dated Oct. 22, 2004, PCT/US04/005922 (17 pgs).
PCT International Preliminary Report on Patentability issued in PCT/US2013/031062, dated Sep. 16, 2014 (9 pgs).
Office Action issued in related U.S. Appl. No. 14/071,371, dated Dec. 18, 2014 (11 pgs).
Japanese Office Action (with translation) issued in related application No. 2012-551386, dated Jan. 28, 2015 (9 pgs).
Office Action issued in related U.S. Appl. No. 13/395,627, dated Feb. 5, 2015 (7 pgs).
Chinese Board Decision, Appln. No. 200580048306.3, dated Dec. 26, 2014 (14 pgs).
Office Action issued in related U.S. Appl. No. 12/373,245, dated Feb. 9, 2015 (11 pgs).
Office Action issued in related U.S. Appl. No. 12/918,466, dated Jul. 11, 2013 (36 pgs).
India Hearing Notice in Reference of Application No. 3011/CHENP/2007, dated Feb. 5, 2015 (1 pg).
Chinese Office Action issued Jul. 1, 2014 with English translation, Appln. No. or Patent No. 201180007957.3 (17 pgs).
Notice of Allowance issued in U.S. Appl. No. 13/395,627, dated Sep. 16, 2015 (22 pgs).
Office Action issued in U.S. Appl. No. 12/373,245, dated Sep. 9, 2015 (20 pgs).
Chinese Office Action issued in application No. 201280057499.9, dated Aug. 28, 2015 (13 pgs).
Indian Office Action issued in application No. 137/CHENP/2009, dated Oct. 29, 2015 (2 pgs).
Office Action issued in U.S. Appl. No. 12/918,466, dated Nov. 19, 2015 (25 pgs).
Extended European Search Report issued in application No. 12836396.7, dated Nov. 10, 2015 (12 pgs).
Chinese Office Action (w/translation) issued in application No. 201380022758.9, dated Dec. 14, 2015 (12 pgs).
Banister et al., "Molecular Engineering of Polymer Actuators for Biomedical and Industrial Use," Electroactive Polymer Actuators and Devices (EAPAD) 2012, vol. 8340 (20 pgs).
Office Action issued in U.S. Appl. No. 13/018,024, dated Feb. 24, 2015 (31 pgs).
Office Action issued in U.S. Appl. No. 13/424,172, dated Jun. 10, 2015 (25 pgs).
Office Action issued in U.S. Appl. No. 14/347,597, dated Jun. 3, 2015 (33 pgs).
Indian Office Action issued in application No. 137/CHENP/2009, dated Mar. 17, 2015 (2 pgs).
Office Action issued in U.S. Appl. No. 12/745,880, dated Jul. 22, 2015 (23 pgs).
Chinese Office Action issued in application No. 201180007957.3, dated May 22, 2015 (15 pgs).

* cited by examiner

HIGH SURFACE AREA POLYMER ACTUATOR WITH GAS MITIGATING COMPONENTS

CROSS REFERENCE TO RELATED APPLICATIONS

This application claims priority from U.S. Provisional Application Ser. No. 61/300,345, filed Feb. 1, 2010, and from U.S. Provisional Application Ser. No. 61/332,760, filed May 8, 2010, and from U.S. Provisional Application Ser. No. 61/432,108, filed Jan. 12, 2011, the contents of which are incorporated hereby by reference

STATEMENT OF GOVERNMENT INTEREST

This invention was made in part with Government support under contract number 0848528 awarded by the National Science Foundation. The Government may have certain rights in the invention.

FIELD

The present invention relates to volume changing materials. More particularly, the invention concerns polymeric materials that change volume in response to a pH change. The materials advantageously are employed in activators that may be used, for example, as actuators for pumps for administration of therapeutic liquids and will be described in connection with such utility, although other utilities are contemplated.

BACKGROUND

Actuators are devices that generate displacement or force for various applications. These can take on many forms such as motors, air cylinders, hydraulic cylinders, and electromagnetic solenoids to name a few. These actuators are utilized for many different applications and have been in use for decades.

A particular class of polymeric based actuators that have been developed are polymer actuators based on elastic epoxy hydrogel polymers. Such activators work by creating ionic imbalances near electrodes using positive or negative electrical charges at an electrode in contact with or in close proximity to the polymer and an ionic species of the electrolyte. By increasing the density or the number of the amine groups, such as secondary and primary amines, an increase in swelling pressure is attained in the hydrogel. This also has an effect on the swelling and deswelling times.

One way of achieving this is by incorporating Polyamidoamine (PAMAM) polyether dendrimers, poly(propylene imine (PPI)-dendrimers, amino functionalized dendrimers, or combinations thereof, as part of the polymer structure. Dendrimers are highly branched and offer superior numbers of polymer linkage points. They also are commercially available with primary amino surface groups and core amino groups. This makes engineering of the hydrogel possible so that specific performance parameters such as the pressure the gel can produce is determined by formula ratios of materials or by controlling the organization, size and number of branches in polymer structure itself. Hydrogel density and porosity is controlled by the amount of amine functionality and molecular weight of the polyether amines. Hydrogel density and porosity is also controlled by amount of polyethylene glycol diglycidyl ether and/or by the ratio of $H_2O$ or solvent used to polymerize the materials.

A preferred ether for this gel is polyethyleneglycol-dodecylether (polyEGDE), but other ethers also can be used such as cyclohexanedimethanol diglycidyl ether. These ethers produce a very clear and strong hydrogel that reacts hydrophobically to high pH aqueous solutions and swells when exposed to low pH or acidic solutions. Hydrogel density and porosity also can be controlled by adding an amount of oxidizer to the polymer during polymerization. Whether in solution or dry these oxidizers can be further activated chemically electrically or by photons during polymerization to achieve desired properties.

Ionic hydrogel swelling kinetics are achieved by a difference in pH, ions, cations or protons between a solution outside of the hydrogel and a solution inside of the hydrogel or the polymer composition of the hydrogel. These performance characteristics can be controlled several ways. For example, adding acid to the polymer during polymerization creates a hydrogel that has a higher pH swelling property. Hydrogel swelling kinetics also can be controlled by adding salts or alkali solutions to the polymer during polymerization. This is accomplished by chemical, electrical, electrochemical, photo or photochemical excitation of the epoxy polymer or solution that it is hydrated with.

It is possible to create an electro activated polymer (EAP) by hydrating the epoxy hydrogel in an electrolyte, inserting an electrode into the gel, and spacing a second electrode a short distance from the hydrogel and running low amounts of current through the electrodes. For example, epoxy hydrogel swelling may be increased in the region of a platinum electrode using saline as an electrolyte fluid. When the polarity is reversed, the hydrogel will deswell or contract. Control of hydrophobic and hydrophilic properties also can be achieved by these methods.

A challenge with these polymer actuators is to generate forces and strain rates of actuation that are sufficient for pumping fluids.

Another challenge with such polymeric actuators is the generation of gas during operation. Polymeric actuators utilizing electrodes and aqueous electrolytes are particularly advantageous for high efficiency actuation but may hydrolyze out oxygen and hydrogen.

Gases produced in a polymer actuator are undesirable for the effects they may have on charge transfer and the mechanical system. By producing an insulating pocket, a gas bubble will impede charge transfer through the system. This effectively lowers the surface area of the electrode and/or the polymer which reduces the rate of expansion of the polymer. To make matters worse, the gas pocket is variable and unpredictable in size and precise composition, reducing accuracy of any device utilizing a polymeric actuator.

Also, gas expansion may produce an apparent expansion of an actuator that later relaxes due to compression or absorption of the gas. Gas production thus reduces repeatability, predictability, and accuracy of the actuator.

Compounding these consistency problems is the inconsistent adhesion of actuator polymer to a non-reactive substrate. Hydrogels are prone to delamination and typically are not stable in aqueous environments, hindering, for example, thin film characterization and use in aqueous media. Adhesion may require solutions that increase the number of chemicals and process steps leading to increased complexity, and may use chemicals that are not environmentally benign.

There is therefore a need for an actuator that can produce high rates of actuation without the shortcomings of hydrolysis or other gas generation.

There is further a need for a hydrogel actuator that is conveniently adhered to a hydrophobic surface.

Conventional actuators do not meet the full need for such an application. Furthermore state of the art polymer actuators do not isolate and create distinct ionic or pH boundaries of the electrolyte at the anode or cathode side of the electrodes.

Typical electrode materials for polymer actuators are metals, carbons and some conductive polymers. The type of electrode is somewhat dependent on the type of actuator and electrolytic chemistry needed to create the desired response. One drawback to using most metals is that they typically are not stable for both the oxidation and redox reaction at each electrode. Nobel metals such as gold and platinum can be used due to their stability but are very expensive and not practical for industrial type use. Other materials such as carbon and graphite will work but have difficult working mechanical properties making them not practical, and conductive polymers are very limited in their chemical compatibility to other polymers. Another drawback all electrodes have is electrochemical gas generation at the electrode surface interface with the electrolyte. The generation of gas, both in type and volume, is dependent on the polarity of the electrode and the amount of electrical current applied to the electrodes in an actuator or actuator assembly and the electrolyte. Gas creates a significant problem of compressible pressure in closed or sealed actuator systems, and can actually outpace the polymer actuation or volume change thereby creating unreliable results in actuation cycles.

SUMMARY

The present invention overcomes the aforesaid and other problems of the prior art. The invention, in one aspect, provides a polymer actuator assembly having an anode and a cathode separated by a porous membrane in an electrolyte, a metal hydride material in contact with the surface of one or more of the electrodes, and a polymeric actuator in contact with the anode or the cathode. The porous membrane acts as a barrier or separator material and eliminates or reduces comingling of the ionic or pH regions, substantially increasing the response, accuracy, time and volume changes of the actuator material, as well as improving the range of electrode materials and configurations of the cathode and anode electrodes within the device.

The electrodes in solution with the porous membrane facilitate modulation of the pH around the polymeric actuator via charges or ionic separation. The electrolyte may be aqueous or nonaqueous. The polymeric actuator may be configured to expand or contract in response to pH or chemical changes in the electrolyte induced by an electrical potential differential in the electrodes.

The actuator assembly may further provide a sealed flexible outer housing enclosure allowing sealed entrance or exit points for the electrodes. In an alternative embodiment, the assembly provides a second polymeric actuator such that each polymeric actuator is adjacent to one of the electrodes and both actuators are configured to expand or contract simultaneously when an electric potential differential is applied to the electrodes.

The polymeric actuator and the electrode in contact with the polymeric actuator may be sealed inside a flexible container or bag made of the same material as the porous membrane with a portion of the electrode exiting the flexible container. The portion of the electrode outside of the flexible container is then insulated from the electrolyte by porous membrane material to facilitate actuation when the electric potential differential is applied to the electrodes. The flexible container or bag, or at least a portion of the flexible container or bag preferably is composed of an elastomeric material. A rigid structure that is pervious to the electrolyte or solution by being, for example, porous, may surround the polymer actuator material, at least in part, to facilitate the direction of actuation.

The surface area of the polymeric actuator exposed to the actuating stimulus may be increased by pulverizing or grinding the polymeric actuator material into smaller particles or particulates. The particulates of the actuating material may then form a slurry with the electrolyte. The particulates may be enclosed in a flexible, porous enclosure with the electrode in contact with the exterior surface of the enclosure, or with the electrode penetrating the enclosure to be in direct contact with the particulates and the electrolyte immediately surrounding the particulates. The flexible enclosure may be contained, at least in part, in a rigid porous container that directs the action of actuation while allowing fluidic flow of electrolyte through the rigid container.

The actuator assembly may further comprise a gas absorbent material such as activated carbon. Alternatively, gas created in the electrolyte or solution may be collected in a storage area outside of the sealed flexible housing. The storage area is in fluid connection with the electrolyte to allow selective flow of gas, without removing electrolyte into the storage area.

The polymeric actuator of the actuator assembly may act as a platen or piston. Moreover, the electrodes of the actuator assembly may be configured to allow in-line electrical connectivity of a series of actuators in a more complex system. The assembly may include a programmable controller and a power source to create the electrical potential differential in the electrodes power the programmable controller. One or more sensors may communicate feedback to the controller for more automatic operation of the actuator assembly. The actuator assembly or a plurality of actuator assemblies in a desired configuration may be used to pump a fluid.

The invention in another aspect provides a polymeric actuator assembly including a housing, a first electrode and a second electrode, and a electrolyte. The electrodes are separated by a membrane to maintain a pH difference between the electrolyte surrounding the respective electrodes when a voltage is applied between the first and second electrodes. The assembly may include a plurality of polymeric actuators disposed near an electrode that respond to a pH change within the electrolyte.

The polymeric actuator may have increased surface area by pulverizing or grinding the actuating material into granules. The porous container is a polymeric bag, and the granules of actuating material form a slurry with the electrolyte within the bag.

In yet another aspect of the invention, a polymeric actuator component comprises an actuating polymer that increases volume in response to a stimulus cross-linked to a hydrophobic polymer. The actuating polymer and the hydrophobic polymer comprise an ether epoxide and an NH reactant, and preferably the NH component is common to both polymers. The epoxide in the actuating polymer is a hydrophilic di-epoxide, such as polyethylene diglycidyl glycol ether. The epoxide in the hydrophobic polymer is a hydrophobic di-epoxide, such as neopentyl diglycidyl ether or polypropylene diglycidyl glycol ether. The NH reactant may be a polyether amine, such as JEFF AMINE® T-403 available from Huntsman Corporation. The hydrophobic polymer may further comprise polyethyleneimine and water to decrease polymerization time.

The ratio of epoxide to NH reactant in the actuator polymer without dendrimers typically is between about 1 to 2 and about 1 to 10, preferably about 1 to 2.85, and the ratio of epoxide to NH reactant in the hydrophobic polymer typically is between about 1 to 1.5 and about 1 to 3, preferably about 1 to 2.0. By incorporating dendrimers the ratio of epoxide to NH reactant can become significantly different dependent on the number of NH sites on each dendrite molecule these can range from 4 NH units in a 1$^{st}$ generation molecule to over 5,000 in a tenth generation molecule. Polymers incorporating dendrimers would have a much larger epoxide to NH unit ratio and could easily be between 1 to 4 and 1 to thousands of NH units.

The composite hydrogel material of the invention may be used to produce an actuator polymer that is sealed in a defined volume by the hydrophobic polymer, or an actuator polymer that is protected from the external environment by the hydrophobic polymer. The composite hydrogel material may be used as a sensor material structure, gel electrolyte material, selective ion permeable membrane, liquid filtration and treatment component, wound care membrane or acid scavenging material, as well as many other applications that would be recognized by those having skill in the art.

The invention in another aspect provides a polymeric actuator material made by polymerizing an ether reactant including both a hydrophilic ether and a hydrophobic ether and an epoxide. The actuation speed or flexibility of the material may be adjusted according to the ratio of the dominant ether reactant to the lesser ether reactant. In this aspect, the ratio of epoxide to NH reactant typically is preferably between about 1 to 2.5 and about 1 to 3, more preferably about 1 to 2.85. The ratio of hydrophilic ether to hydrophobic ether is between about 100 to 1 and about 1 to 100, typically about 99 to 1.

In yet another aspect, the present invention provides improvements in the electrodes of polymer actuators. An electrode capable of double layer capacity or charge storage within but not limited to an activated carbon layer applied or bonded to the electrode is desirable to control gas generation at the electrode and electrolyte interface in a polymer actuator. This aspect of the invention provides a device for activating a polymer actuator, including one or more polymer actuators, each actuator having one or more double layer capacitor electrodes. The polymer actuators are either activated electrically or activated chemically. The double layer capacitor electrodes are in an electrolyte that may be either aqueous or non-aqueous. The electrodes may be connected to a discharge circuit and a controller, wherein the controller is configured to open and close the discharge circuit at a predetermined time or upon the accumulation of a specified amount of charge in the system.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views, wherein.

DETAILED DESCRIPTION

In the following description directional or geometric terms such as "upper", "lower", and "side" are used solely with reference to the orientation of the Figures depicted in the drawings. These are not to imply or be limited to a direction with respect to a gravitational reference frame but are utilized to distinguish directions relative to each other. Because components of the invention can be positioned in a number of different orientations, the directional terminology is used for purposes of illustration and is in no way limiting. It is to be understood that other embodiments may be utilized and structural or logical changes may be made without departing from the scope of the present invention.

Details in the various embodiments such as how current or wiring is routed to electrodes from power supplies are left out for illustrative simplicity since various methods of such routing is known in the art. The term "electrolyte" refers to and includes all aqueous, non-aqueous, polymer and solid electrolytes, including those that are generally well known in the art. The term "electrodes" refer to anodes and cathodes commonly used in electrochemical systems that are made of materials well known in the art such as metals, carbons, graphenes, oxides or conducting polymers or combinations of these. The term "separator" refers to any nano, micro or macro porous material that allows targeted ions to move through or across it faster than surrounding ion containing media. The term "ion" refers to ions and ion species as well as anion, cation, electrons and protons, and concentration values of these. The term "housing" refers to the exterior portion of the device which may be fabricated from flexible material, rigid material, elastic materials, non elastic materials or a combination of these such as rubbers, silicone, polyurethane, metalized polymer films and other plastics or polymers known in the art. The housing is configured to allow movement and expansion of the internal parts as well as allowing for filling the device with electrolyte, acting as a container and barrier to stop any electrolyte leakage or evaporation, allowing electrodes to make electrical contact with power source as well as to enter and exit the housing, if needed, and also the ability to vent any unwanted gas generation, if needed.

Referring to the drawings, an actuator 100 is comprised in part of a polymeric actuating material. In an exemplary embodiment these polymer actuators are formed from ion or pH responsive epoxy polymer Hydrogel based polymers. Examples of such polymers are described in commonly owned WIPO patent application WO 2008/079440 A2, Entitled 'SUPER ELASTIC EPOXY HYDROGEL", filed on Jul. 10, 2007 and published on Jul. 3, 2008. Other polymer actuator examples may contain polymers which have ionic functional groups, such as carboxylic acid, phosphoric acid, sulfonic acid, primary amine, secondary amine, tertiary amine, and ammonium, acrylic acid, methacrylic acid, vinylacetic acid, maleic acid, meta kurir yl oxy ethylphosphoric acid, vinylsulfonic acid, styrene sulfonic acid, vinylpyridine, vinylaniline, vinylimidazole, aminoethyl acrylate, methylamino ethyl acrylate, dimethylamino ethyl acrylate, ethylamino ethyl acrylate, ethyl methylamino ethyl acrylate, diethylamino ethyl acrylate, aminoethyl methacrylate, methylamino ethyl methacrylate, dimethylaminoethyl methacrylate, ethylamino ethyl methacrylate, ethyl methylamino ethyl methacrylate, diethylamino ethyl methacrylate, aminoproply acrylate, methylaminopropyl acrylate, dimethylamino propylacrylate, ethylaminopropyl acrylate, ethyl methylaminopropyl acrylate, diethylamino propylacrylate, aminopropyl methacrylate, methylaminopropyl methacrylate, dimethylaminopropyl methacrylate, ethylaminopropyl methacrylate, ethyl methylaminopropyl methacrylate, polymers, such as diethylamino propyl methacrylate, dimethylaminoethyl acrylamide, dimethylaminopropylacrylamide, and alpha kurir yl oxy ethyl trimethylammonium salts, are reported to be of use but these examples are for reference and not intended to limit the scope or use of the invention.

The invention in one aspect comprises new actuating polymers comprised of hydrophobic materials cross linked with smart hydrogel polymers using multiple di-epoxides or polyepoxides as the cross linking mechanism to adhere the materials together at the molecular level. The composite material also may be formed by using a single diepoxide or polyepoxide and then cross linking different layers of material via the polyamine components such as JEFF AMINE® with different functionalities or polymer chains and back bones.

Previously filed PCT/US2007/073188 (hereby incorporated in its entirety), describes unique epoxy hydrogel polymers formed by reacting a polyether amine with a polyglycidyl ether. The resulting polymer is a super elastic hydrogel having various applications. The epoxy hydrogel can be produced by mixing ratios of "ether reactants" such as polyethylene glycol diglycidyl ether and polyoxyalkyleneamines and H2O resulting in an aqueous polymerization of the materials. Particularly preferred are polyoxyalkyleneamines such as commercially available from Huntsman Corporation under the brand name JEFF AMINE® and other polyether amines as an "epoxy" component that is reacted with various ethers to form epoxy hydrogels. The polyoxyalkyleneamines contain primary amino groups attached to the terminus of a polyether backbone. They are thus "polyether amines." The polyether backbone is based either on propylene oxide (PO), ethylene oxide (EO), mixed propylene oxide/ethylene oxide or may contain other backbone segments and varied reactivity provided by hindering the primary amine or through secondary amine functionality.

In one embodiment of the invention, hydrophilic variants of hydrogel polymer actuators are cross linked based on JEFF AMINE® T-403 and Polyethylene digycidyl glycol ether to hydrophobic variants of the gel by changing the diglycidyl (ether reactant) component and keeping the same epoxy-JEFF AMINE® T-403 component.

Figure 1A:
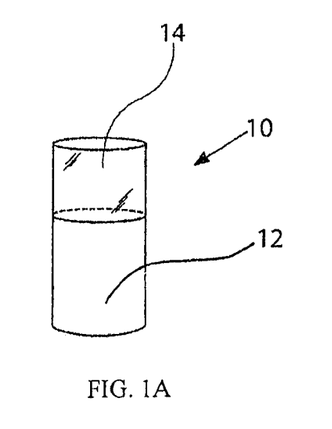
FIGS. 1A and 1B depict exemplary composite epoxy polymer actuator components before and after activation according to one aspect of the present invention.

Referring in particular to FIG. 1A, simple cylinders 10 comprised of half hydrophilic actuator material 12 and half non actuating hydrophobic material 14 cross linked together at the molecular level may be cast. The actuator material 12 is first placed into a mold or cast and partially cured. Then, a second material is added to the mold and both materials are allowed to totally cure. Ratios of di-epoxides to NH may be varied, and both neopentyl diglycidyl ether and polypropylene diglycidyl glycol ether may be substituted for the polyethylene diglycidyl glycol ether used in the actuator material. A mixture of JEFF AMINE® T-403 and Neopentyl glycol diglycidyl ether yields a polymer with hydrophobic properties advantageous to actuator applications. In this way, two or more types of epoxy polymers may be adhered together even though they have very different properties.

Figure 1B:
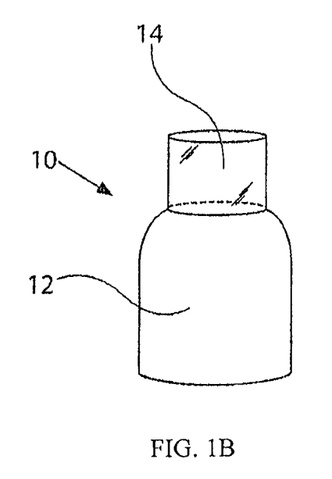
Figure 1C:
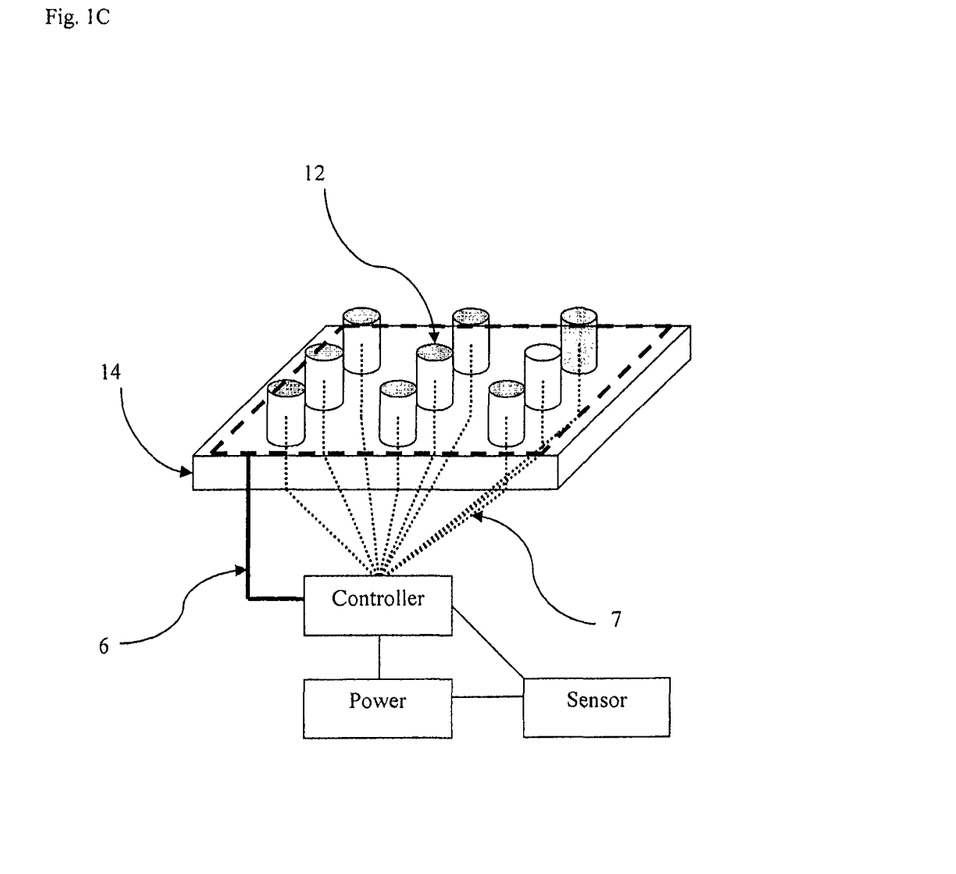
FIG. 1C depicts an exemplary array of composite epoxy polymer actuator components in accordance with the present invention.

In a specific embodiment, the hydrophobic polymer 14 is bonded to the actuator material 12. In FIG. 1C the hydrophobic polymer 14 is bonded to the actuator hydrophilic material 12 with addressable electrodes 6 and 7 electrically connected to the controller sensor or sensors and power source. A number of different chemicals may be added to JEFF AMINE® T-403 in order to form a polymer with both hydrophobic properties and the ability to bind to an actuator gel such as that described in previously filed PCT/US2007/073188. For example, neopentyl glycol diglycidyl ether may be added to JEFF AMINE® T-403 with an Epoxide/NH Reactant ratio of 1 to 2.85, the same Epoxide/NH Reactant ratio present in the standard actuator gel formulation. To ensure prompt polymerization, the ratio of epoxide/NH Reactant ratio may be decreased. Neopentyl glycol diglycidyl ether and JEFF AMINE® T-403 mixtures with an Epoxide/NH Reactant ratio of 1 to 1.7, 1.8, 1.9, and 2.0 were all found to successfully polymerize after heating at 60 degrees C. for 5 hours and further curing at room temperature for 72 hours. The hydrophobicity of the polymers with these ratios yielded an approximate maximum of about 8-10% swelling after storage in water for up to three weeks. Furthermore, as the Epoxide/NH Reactant ratio is increased, the elasticity of the resultant polymer is also increased. As a result, a mixture of JEFF AMINE® T-403 and neopentyl glycol diglycidyl ether with an Epoxide/NH Reactant ratio of 1 to 2.0 displays excellent adhesion with the actuator polymer 12, not only after curing, but also with hydration.

If desired, the hydrophobicity may be increased and the time required for polymerization decreased. Poly (propylene glycol) diglycidyl ether (PPGDGE) may be added to a mixture of Neopentyl glycol diglycidyl ether and JEFF AMINE® T-403, maintaining an Epoxide/NH Reactant ratio of 1 to 2.0. or more Polymers with 10%, 26%, and 50% PPGDGE were synthesized and stored in water to test their hydrophobicity or resistance to swelling. All gels swelled between 12% and 15% after storage in water for two weeks. Further, it was surprisingly found that the addition of PPGDGE results in a decrease in polymer elasticity as compared to the base Neopentyl glycol diglycidyl ether and JEFF AMINE® T-403 polymer.

In order to decrease gel curing time, Polyethyleneimine (1300 molecular weight) may be added to the base Neopentyl glycol diglycidyl ether and JEFF AMINE® T-403 gel. The addition of 10% and 15% polyethyleneimine along with 10% water results in gels that polymerize more quickly. The gels completely polymerized after heating at 60 degrees C. for 5 hours and did not require further curing at room temperature to decrease gel stickiness.

The advantage of faster polymerization may be accompanied by a decrease in hydrophobicity. These gels including Polyethyleneimine were found to swell between 23% and 32% after storage in water for two weeks. Therefore, polymers with an increased hydrophobicity and decreased polymerization time are possible, but may be accompanied by performance tradeoffs, particularly in the hydrophobicity of the resultant polymer.

The length of the polymer chain and amine ratio versus Epoxide/NH Reactant ratios also may decrease polymerization time in a hydrophilic actuator gel. For example, varying compositions were evaluated using Polyethyleneimine, (branched polymers similar to Epomin SP-012) low mol. Wt. 50 wt. % soln. in water, both 2000 and 1300 molecular weights. Resulting gels were able to polymerize at room temperature in approximately 40 minutes, with ratios of epoxide to NH as high as 1 to 7 or more. These gels were comparatively brittle and stiff, showed a normal range of % hydration at approximately 400% consistent with our standard gel formulation Initial actuation testing of new composite actuator structures comprised of a hydrophilic actuator polymer and a hydrophobic polymer depicted graphically in FIG. 1B successfully showed 100% swelling at each actuator portion under positive electric current of 1 mA. Accordingly, an addressable location peristaltic type of pump mechanism, or an array of actuators as shown in FIG. 1C may effectively be constructed of the examined composite polymers. Similarly, the examined polymers were shown to be smart and chemical responsive hydrogels, capable of being used in a variety of applications. Materials comprising these polymers may be cast in many layers and shapes that would be advantageous to a particular use and application.

In another embodiment of the invention, two or more of the di-epoxides are combined into one singular polymer actuator composition and the performance of the actuator material is adjusted according to the ratio of the dominant functional di-epoxide to the lesser functional di-epoxide. The ratio of the dominant functional di-epoxide to the lesser functional di-epoxide may be varied to advantageously vary actuation speed or flexibility of the material. In a particular embodiment, 1% neopentyl glycol diglycidyl ether is added to the JEFF AMINE® T403 and PEGDE formulation mentioned in previous PCT/US2007/073188, resulting in a much faster actuator. This is not intended to limit the use or the materials used in a composite assembly made by cross-linking the functional layers.

A composite hydrogel material may be used as a sensor material structure, gel electrolyte material, selective ion permeable membrane, liquid filtration and treatment, wound care membrane, actuator or even acid scavenging material. This process also may be used to seal the external layer or layers of a composite structure such as an actuator thereby effectively sealing in the electrolyte held within or around the polymer to protect from evaporation. Additionally, internal materials may be protected from the external environment by UV exposure protection using the described composite hydrogels. The embodiments described above are just a few examples for which the composite hydrogel of the invention may be used for and are not meant to limit the scope of the invention.

In one application, the present invention concerns improvements made to a polymeric actuator including an increase in effective surface area to increase magnitude and repeatability of an expansion rate of a polymeric actuator. This has been accomplished by increasing the actual surface area of the polymer and by increasing the effective surface area, electrode improvements, and by gas mitigation methods. The improvements of this invention have been demonstrated to achieve a 400% increase in a volumetric expansion rate over prior art methods while reducing variability.

Figure 2A:
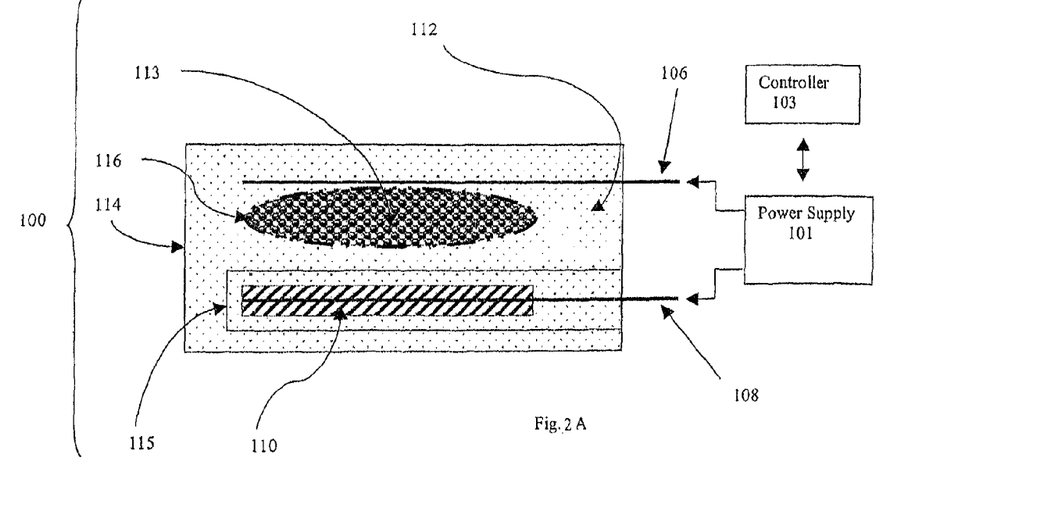
FIG. 2A depicts an exemplary actuator assembly of the present invention in schematic form.

An exemplary embodiment of an actuator assembly 100 according to the present invention is schematically depicted with respect to FIG. 2A. Actuator assembly 100 includes a polymeric actuator material 113 and an associated electrode set including top electrode 106 and bottom electrode 108. Bottom electrode is in contact with metal hydride material 110. The electrode set and the polymeric actuator 113 are contained within housing 114. The housing 114 may be formed with folds, pleats or other excess material on the sides in order to allow for the large expansion rates of the actuator material as well as providing storage pockets or areas for any excess gas generated to collect without impacting the expansion rate of the actuator assembly. An electrolyte 112 is also contained within housing 114 in contact with the electrode set (106, 108) and actuator 113. Actuator 113 is a polymerized polymer actuator particulate made by grinding hydrated epoxy gel, and placing the gel into a flexible porous bag 116. The actuator 113 may also be comprised of two or more of the di-epoxides described above to vary the performance of the actuator material. Bag 116 is made of woven polypropylene mesh 116, 0.006" thick with 150 micron hole sizes and heat sealed. One or more bags can be used in the configuration to take advantage of volume and stroke aspects. A porous separator membrane 115 separates the pH gradient between electrode 108 and opposing electrode 106 while still allowing contiguous electrolyte 112.

Polymeric actuator 113 will expand or contract in response to a change in the electrolyte 112. There are several types of polymeric actuators 113 that may be used, including an "acid-responsive" polymeric actuator and a "base-responsive" polymeric actuator. An "acid-responsive" polymeric actuator expands in response to a decreased pH in electrolyte 112 surrounding polymeric actuator 113. This can be accomplished by providing a positive bias of electrode 106 relative to electrode 108. Applying the positive bias causes current to flow from electrode 106 to electrode 108 and causes a positive ion (H+) concentration in the electrolyte 112 surrounding actuator 113 to increase. The voltage applied between electrodes arranged in the aqueous solution consumes hydrogen ion and/or hydroxide ion as a result of electrode reaction or yields a concentration gradient due to electric double layer occurring on the surfaces of the electrodes, thereby changing the pH in the vicinity of the electrodes. Thus the electrolyte surrounding actuator 113 becomes more acidic (lower pH) and causes actuator 113 to expand.

Since the expansion speed of a solid polymer gel block is limited by the ability of the electrolyte or solvent to diffuse through the polymer actuator the speed of actuation may be increased by increasing the surface area of the polymer actuator material with access to the electrolyte. If the electrical bias is reversed, the positive ion flow reverses and electrolyte 112 surrounding actuator 113 becomes more basic (or less acidic) which causes an opposite or reverse effect on actuator 113.

A "base-responsive" polymeric actuator 113 also may be used. In that case, applying a negative bias to electrode 106 relative to electrode 108 will cause the pH in the electrolyte 112 surrounding polymeric actuator to increase which will in turn cause the base-responsive polymeric actuator 113 to expand. In this case the metal hydride 110 would be in contact with the electrode 106 in an aqueous electrolyte solution depending on the electrolyte, electrochemical reaction and type of gas produced during operation. When the polymeric actuator 113 expands, it causes the entire actuator assembly 100 to expand.

Figure 2B:
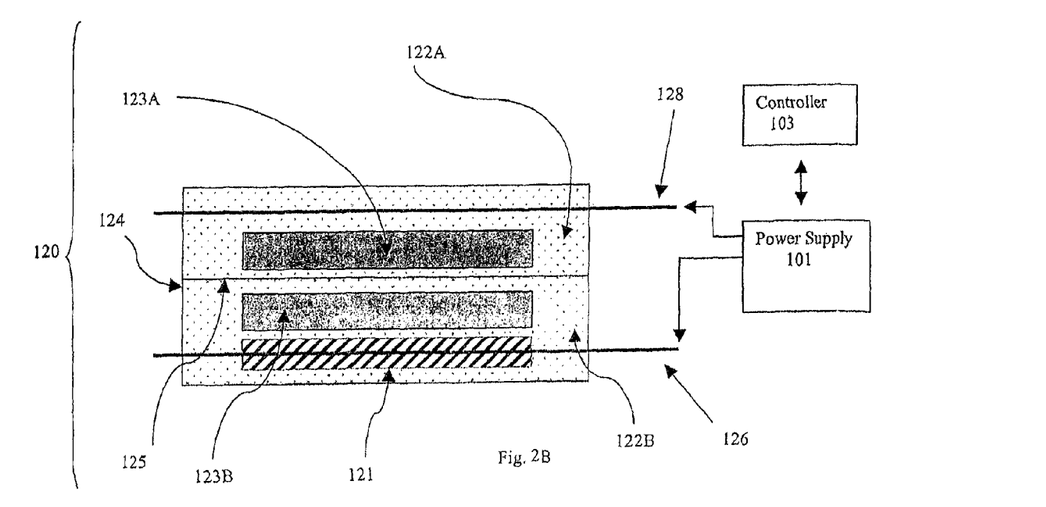
FIG. 2B depicts another exemplary actuator assembly of the present invention in schematic form including, among other things, a plurality of actuating areas.

An alternative design of an actuator assembly 120 utilizing both acid responsive and base responsive actuators is depicted in FIG. 2B in schematic form. Actuator assembly 120 includes an acid responsive polymeric actuator cast gel 123A, a base responsive polymeric actuator cast gel 123B, a top electrode 128, and a bottom electrode 126 in contact with metal hydride 121 and then exiting the housing, all within housing 124. An electrolyte 122A surrounds top electrode 128 and acid responsive actuator 123A; a bottom electrolyte 122B surrounds bottom electrode 126 and base responsive actuator 123B. A porous separator membrane 125 separates the top electrolyte 122A from the bottom electrolyte 122B while allowing ions to flow between electrolytes.

When a positive bias current is applied between top electrode 128 and bottom electrode 126 the pH of the top electrolyte 122A decreases while the pH of the bottom electrolyte 122B increases. The decreased pH (acidity increase) of top electrolyte 122A causes acid responsive polymer material 123A to expand while the increased pH (more basic) of bottom electrolyte 122B causes base responsive polymer material 123B to expand. Having two layers of actuators may double the total displacement obtainable for the entire actuator assembly 120. It is anticipated that additional layers of polymeric actuators with alternating layers of acid responsive and base responsive polymeric actuators can be used to further increase the maximum aggregate expansion of actuator assembly 120.

Figure 2C:
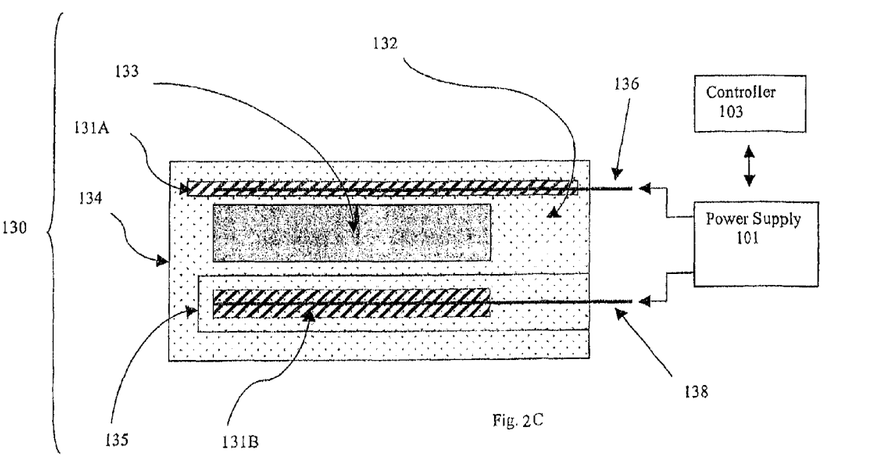
FIG. 2C depicts another exemplary actuator assembly of the present invention in schematic form including, among other things, a hydride material surrounding each electrode of the actuator assembly.

An alternative embodiment of an actuator assembly 130 is depicted with respect to FIG. 2C and includes the same embodiment of actuator assembly shown in FIG. 2A with the addition of a top electrode 136 with metal hydride material 131A in contact with top electrode 136, as well as the bottom electrode 138.

An alternative embodiment of an actuator assembly 130 is depicted with respect to FIG. 2C and includes the same embodiment of actuator assembly shown in FIG. 2A with the polymer actuator material as a cast gel, it is also possible to use multiple actuator material castings or bags in the same configuration, the same would be true for all of the configurations depicted, also shown is a top electrode 136 with metal hydride material 131A in contact with top electrode 136, as well as the bottom electrode 138.

Figure 3A:
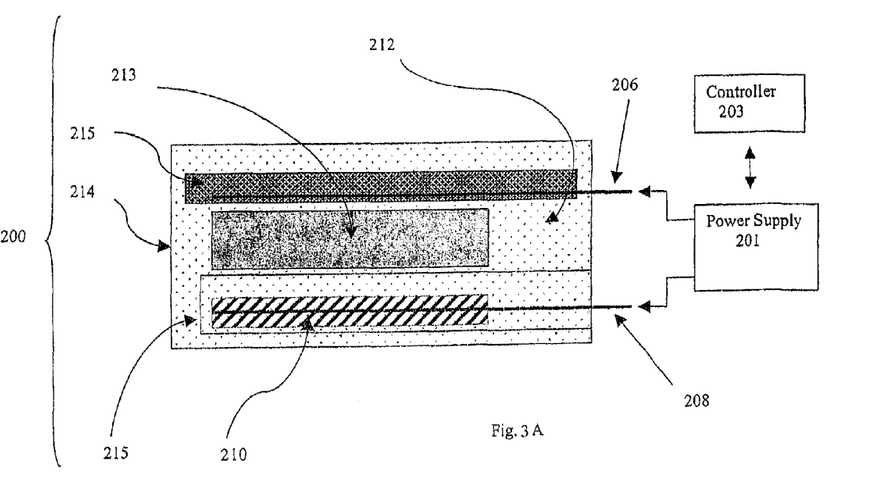
FIG. 3A depicts an exemplary actuator assembly of the present invention in schematic form including, among other things, a gas absorbent material.

Another polymer actuator assembly embodiment is shown in FIG. 3A wherein the top electrode 206 is in close proximity to gas adsorbing material 215 such as an activated carbon which can adsorb, for example, oxygen when wet. The gas adsorbing material is in contact with electrolyte 212 and adsorbs gas produced at electrode 206 as the gas migrates through electrolyte 212. Bottom electrode 208 is in contact with metal hydride material 210. The electrode set and the polymeric actuator material as a cast gel 213 are contained within housing 214. Contained within housing 214 is an electrolyte 212 in contact with the electrode set and actuator material 213. Separating electrode 208 from surrounding electrolyte 212 is a porous separator membrane 215. Polymeric actuator 213 will expand or contract in response to a change in the electrolyte 212, utilizing the same type of actuation mechanism and response described for FIG. 2A.

Figure 3B:
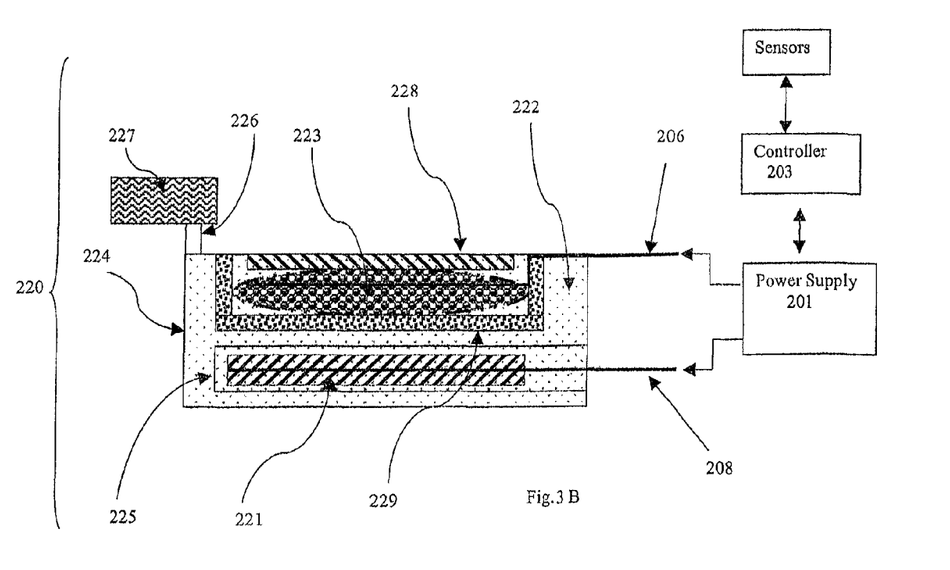
FIG. 3B depicts an exemplary actuator assembly of the present invention in schematic form including, among other things a separate chamber to sequester gas(es) that may be produced in the actuator.

Yet another preferred polymer actuator assembly embodiment is shown in FIG. 3B wherein the actuator material 230 is a polymer particulate held in a porous flexible bag 223 and then the polymer particulate containing bag 223 is held in a firm porous structure 229 helping to contain and direct the swelling flexible bag 223 in one direction during the polymer material's 230 actuation response for efficiency of stroke or improved distance that the plate 228 can be pushed by flexible bag 223 expanding due to the swelling of the polymer material 230. The Top electrode 206 is inserted into the particulate bag 223 between the polymer particles 230 to maximize contact.

The assembly 224 is vented into another gas absorbing material 227 such as "Oxisorb" liquid form oxygen absorbent. The gas absorbent 227 is separated from the electrolyte by hydrophobic separator materials 226 that allow gas to penetrate while constraining electrolyte fluid. It is possible also to have no absorbent 227 in the vent in order to merely contain the gas in a separated compartment so the gas does not impact the actuation of the polymer materials. The separator material 226 is in contact with electrolyte 222 and allows gas produced at electrode 206 to collect as the gas migrates through electrolyte 222. Bottom electrode 208 is in contact with metal hydride material 221 which allows gas to adsorb to the metal hydride material 221. The electrode set (206, 208) and the polymeric actuator 223 are contained within housing 224 in contact with an electrolyte 222. A porous membrane 225 may separate electrode 208 from surrounding electrolyte 222.

Shown in all figures is the electrical power supply 101 and controller 103 for control of the actuator assembly's motion, speed and force. The embodiment in FIG. 3B also shows interaction with a sensor 105 for feedback and automated control of the actuator assembly.

There are many gas mitigation materials and techniques that are well known in the art of various analytical sciences and methods such as HPLC or other methods of chromatography, all of the embodiments described are meant to show possible actuator assembly configurations utilizing gas mitigation materials, components and techniques as part of the assembly and are not meant to limit the scope of the invention in any way.

In another aspect of the present invention, an electrode capable of double layer capacitance or charge storage is used to control gas generation within the actuator. For example, psuedocapacitor type electrodes may be used to control gas generation.

According to the present invention the electrical current builds a charge layer instead of generating gas at the electrolyte and electrode surface interface. This process continues until the electrode is fully charged, at which point, the charge is disbursed and the gas is produced.

Figure 4:
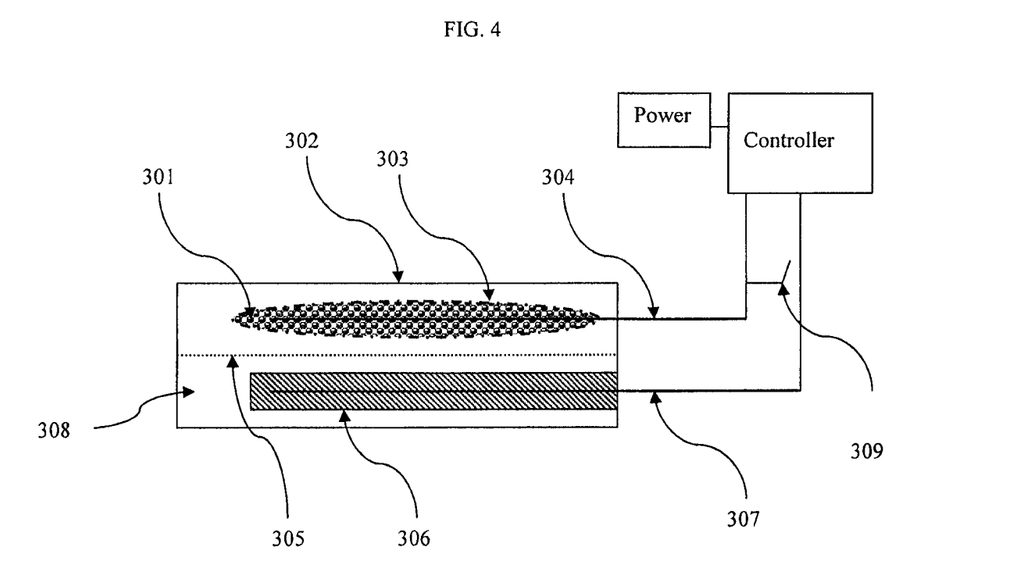
FIG. 4 depicts an actuator assembly in schematic form, including a double layer capacitor electrode, according to one aspect of the present invention.

As seen in the example shown in FIG. 4, the actuator assembly is contained in a flexible non permeable housing material 302 such as (but not limited to) a metalized polyethylene film. The housing contains the electrolyte 308, polymer actuator material 301, semi porous container for the polymer 303, the electrode in contact with or in the vicinity of the polymer 304, a semi porous separator membrane or sheet 305 located between the electrodes, a carbon PTFE capacitive layer coating 306 and the opposing electrode 307 in electrical connection with discharge circuit 309, controller and power source.

In one example of the present aspect of the invention, the electrode is discharged at a predetermined time in the charge cycle. In this example, the point at which the gas is generated is a function of the predetermined time, rather than the rate at which the energy accumulates within the capacitor. Once the discharge occurs, the charging process starts again, thereby eliminating gas generation at the electrode by using charge and discharge cycles.

To manufacture this type of electrode, a Teflon (PTFE) aqueous emulsion, such as those made by DuPont, is mixed with a high surface area carbon or other high surface area material, such as, for example, activated carbon; oxides such as, for example, metal oxides; as well as other materials such as metal hydrides. These materials can be used either on their own or mixed together to produce a desired performance curve of gas mitigation at the electrode. The high surface area material is mixed with the emulsion and pressed or coated onto the electrode and baked to the correct processing temperature to bind the mixture together and to the electrode, this process is well known in the art of battery and capacitor manufacturing. The electrode substrate can be perforated, expanded or plated with solid metals (such as but not limited a low cost aluminum or stainless steel foil), such as is well known in the art.

It should be emphasized that the above-described embodiments of the present invention, particularly, any "preferred" embodiments, are merely possible examples of implementations, merely set forth for a clear understanding of the principles of the present invention. Many variations and modifications may be made to the above-described embodiments without departing substantially from the spirit and principles of the invention. All such modifications and variations are intended to be included herein within the scope of this invention and protected by the following claims.

What is claimed is:

1. An electro-activated polymer actuator device, comprising in combination,
   an electrolyte;
   a sealed outer housing holding the electrolyte, and formed of a flexible metalized polyethylene film material non-permeable by the electrolyte;
   a semi-porous membrane material dividing the outer housing into a first space and a second space;
   a polymer actuator material contained in a semi-porous housing in the first space;
   a first electrode in contact with the polymer actuator material in the first space; and
   a second electrode having a double layer capacitive layer coating formed of a carbon polytetrafluoroethylene (PTFE) coating layer in the second space, and
   wherein the sealed outer housing is provided with excess material to allow for expansion of the outer housing.

2. The device of claim 1, wherein the polymer actuator device is activated electrically.

3. The device of claim 1, wherein the polymer actuator device is activated chemically.

4. The device of claim 1, wherein the double layer capacitor electrode is in a non-aqueous electrolyte.

5. The device of claim 1, wherein the double layer capacitor electrode is in a aqueous electrolyte.

6. The device of claim 1, wherein the double layer capacitor electrode is connected to a discharge circuit, and wherein the discharge circuit is in electrical contact with a controller.

7. The device of claim 6 wherein the discharge circuit includes a storage device to store and reuse electrical charge.

8. The device of claim 6, wherein the controller is configured to open and close the discharge circuit at a predetermined time or upon the accumulation of a specified amount of charge in the system.

9. The device of claim 1, comprising two or more of said polymer actuator devices connected in series, forming a pump.

10. The device of claim 1, wherein the first electrode and the second electrode each have a double layer capacitive layer coating.

* * * * *